Dec. 10, 1968 M. ZERBST ET AL 3,416,045

SEMICONDUCTOR DEVICE, PARTICULARLY FOR RESPONSE TO VARIABLE PRESSURE

Filed Oct. 21, 1965 2 Sheets-Sheet 1

Dec. 10, 1968 M. ZERBST ET AL 3,416,045

SEMICONDUCTOR DEVICE, PARTICULARLY FOR RESPONSE TO VARIABLE PRESSURE

Filed Oct. 21, 1965 2 Sheets-Sheet 2

United States Patent Office 3,416,045

Patented Dec. 10, 1968

3,416,045

SEMICONDUCTOR DEVICE, PARTICULARLY FOR RESPONSE TO VARIABLE PRESSURE

Manfred Zerbst, Karl-Heinz Zschauer, and Wolfgang Touchy, Munich, Germany, assignors to Siemens Aktiengesellschaft, Munich, Germany Filed Oct. 21, 1965, Ser. No. 499,610
Claims priority, application Germany, Oct. 22, 1964, S 93,833
2 Claims. (Cl. 317—234)

ABSTRACT OF THE DISCLOSURE

The invention provides a semiconductor body of one conductivity-type with a zone of the other conductivity-type forming a p-n junction in one surface. The lateral ends of the zone penetrate more deeply assuring uniformity in the more shallow central portion on which mechanical pressure means for transmitting a signal engages.

Our invention relates to semiconductor devices of the type having one or more broad-area p-n junctions closely beneath the semiconductor surfaces, and, more particularly, to pressure-sensitive semiconductor devices having a tip or point seated on the just-mentioned surface to apply variable pressure thereto.

P-n junctions whose edge emerges at the same semiconductor face to which the junction area extends substantially parallel, for example alloyed or diffused junctions such as those made by the planar technique, often exhibit breakdown voltages considerably below the values expected from the properties of the fundamental semiconductor material. Investigation has shown that, aside from such other causes as surface effects and premature breakdowns through so-called pipes, the geometry of the p-n junctions is a determining factor for the occurrence of the breakdown phenomena. This is because a p-n junction, possesses beside its planar portion a marginal zone which is curved to a greater or lesser extent depending upon the penetrating depth of the p-n junction. Due to the modified field distribution in the curved marginal zone, its breakdown voltage necessarily differs from that of the planar portion.

Experience with pressure-sensitive semiconductor devices has shown that the p-n junction closely beneath the semiconductor surface is especially sensitive to pressure in its marginal zone where the junction is curved and hence the electrical field is particularly high. This effect, however, cannot be utilized technologically because the marginal region has extremely slight spacial dimensions. Due to its lower breakdown voltage, the marginal zone reduces the magnitude of the pressure effect attainable in the junction area proper. This renders such pressure-sensitive semiconductor devices virtually inapplicable for some purposes, particularly microphones.

It is an object of our invention to avoid the reduction in breakdown voltage and the limitation of the pressure sensitivity to a narrow marginal region due to the marginal curvature of the p-n junction.

Another object is to increase the pressure sensitivity of such devices.

To achieve these objects, and in accordance with our invention, the p-n junction in a device of the type mentioned is formed of a middle planar portion extending closely beneath and parallel to a face of the semiconductor crystalline body, and a marginal portion located on both sides of the planar portion and partially curved with respect to the same body face, and the largest distance of the curved marginal portion from the semiconductor face is made larger than that of the planar middle portion.

A p-n junction with a marginal region satisfying the just-mentioned requirement of the invention, considerably increases the breakdown voltage of the semiconductor device, in comparison with a device having a p-n junction closely beneath the surface whose penetrating depth over its entire area virtually corresponds to the penetrating depth of the planar portion of a p-n junction according to the invention. Furthermore, the semiconductor device according to the invention not only exhibits in the planar region of the p-n junction a uniform pressure sensitivity but also a greatly increased sensitivity relative to otherwise comparable device of the above-mentioned known type.

According to a particularly advantageous embodiment of the invention, the largest distance of the marginal region from the semiconductor surface amounts to a multiple of the distance of the planar portion, preferably to at least four times the latter distance. There is no upper limit with respect to the largest distance of the marginal region from the semiconductor surface as far as elimination of the marginal curvature effect is concerned; such limitation being dependent only upon the dimensions of the semiconductor device.

The invention will be further described with reference to embodiments of pressure-sensitive semiconductor devices according to the invention illustrated by way of example on the accompanying drawing.

Figure 1:
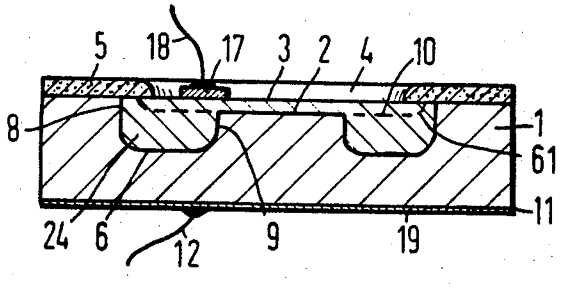
FIG. 1 shows schematically and in cross section a planar diode according to the invention.

The diode shown in FIG. 1 comprises a semiconductor body 1 for example of n-type conductance which may consist of monocrystalline silicon. The body has the shape of a circular disc. It possesses a p-type zone 24 produced by diffusion. The p-n junction extending between the two zones 1 and 24 comprises a partially curved marginal portion 6 and a planar middle portion 2. The planar portion 2 is located closely beneath the flat face 3 of the semiconductor body. The distance from the face, particularly in pressure-sensitive semiconductor devices, should not be larger than 1 micron ($\mu$m.), preferably only about 0.5 $\mu$m. At those localities where the p-n junction emerges at the surface, it is covered by an oxide coating 5 which may consist of an inorganic oxide, particularly the oxide of the semiconductor material. In the present example, therefore, the coating preferably consists of silicon dioxide.

A broken line 10 in FIG. 1 indicates schematically the further extent of the p-n junction 2 as it would correspond to a known planar diode; the curved regions 61 being responsible for the observed reduction in breakdown voltage. By virtue of the curved-contour marginal region 6 of the p-n junction in a semiconductor device according to the invention, the marginal curvature of the p-n junction is reduced in comparison with the broken-line p-n junction of a normal diode. This reduced curvature results in increased breakdown voltage.

Thus, for example, a normal planar diode, that is a diode whose p-n junction comprises the broken-line portion 10 and the planar portion 2, exhibits a breakdown voltage of 30 volts, whereas a planar diode as shown in FIG. 1 exhibits a breakdown voltage of 50 volts under otherwise the same doping conditions. The distance of the planar portion 2 of the p-n junction from the semiconductor face 3 in the present embodiment is 0.5 $\mu$m., whereas the largest distance of the curved marginal region 6 from face 3 is 4.5 $\mu$m., and consequently corresponds to nine times the spacing of the planar portion from the same face 3.

In the preferred embodiments of the invention illustrated on the drawing, the marginal region extends concentrically to the planar portion of the p-n junction. Furthermore, the planar portion has the shape of a circular disc which is surrounded by a ring-shaped marginal region. However, other shapes of the planar portion are also applicable, for example the shape of a triangle, quadrangle or other polygon, or the shape of an ellipse. The marginal region, having the larger spacing from the surface, then surrounds the polygon (for example triangle or quadrangle) or the elliptic area in analogy to the description given above with reference to a circular disc.

Furthermore, in the preferred embodiments shown on the drawing, the marginal region has the shape of a groove whose one edge is adjacent to the planar portion of the p-n junction and whose other edge extends up to the surface of the semiconductor body. In FIG. 1, the edge of the groove adjacent to the planar portion 2 of the p-n junction is denoted by 9. The other edge, denoted by 8, emerges at the semiconductor face 3 of the disc-shaped semiconductor 1 where it is covered by the oxide coating 5.

The desired increase in breakdown voltage does not necessarily require the p-n junction to emerge at the top face. The same effect is secured, for example, when the size of the semiconductor device is reduced by a peripheral cut perpendicular to face 3 within the partially curved marginal junction area 6. This makes the p-n junction emerge at the semiconductor peripheral surface and requires this surface region to be likewise covered by a protective coating such as an oxide.

The diode shown in FIG. 1 is provided with a contact electrode 19 and a supply lead at the flat bottom face. Another contact electrode 17 is attached in an opening 4 of the oxide coating and provided with another lead 18.

Figure 2:
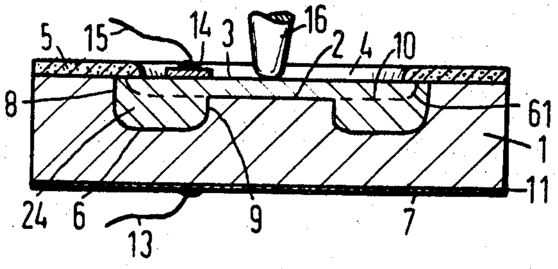
FIG. 2 shows also in cross section a pressure-responsive semiconductor device with a p-n junction according to the invention.

The semiconductor device shown in FIG. 2 comprises a pressure point of variable contact pressure. This point is located within the planar portion of the p-n junction and engages the semiconductor surface. The semiconductor body 1 may consist of n-type silicon and the zone 24 of p-type silicon, for example. The point 16 is seated in the center of the planar portion of the p-n junction 2. Used as material for the pressure point is sapphire, for example. A contact electrode 14 located in the opening 4 of the oxide coating 5 forms a barrier-free contact with the zone 24 and is connected with an electric lead 15. The opposite face 11 is contacted, preferably over its entire area, by an electrode 7 to which an electric lead 13 is connected.

The pressure oscillations produced by a diaphragm, for example in a microphone, are transmitted by the point 16 onto the semiconductor surface. If the pressure sensitivity of the semiconductor device is to be utilized, the p-n junction composed of the planar portion 2 and the curved-contour marginal region 7, is biased by a voltage in the blocking direction. The varying pressure at point 16 then varies the blocking current at the p-n junction. Essential to pressure sensitivity is substantially only the planar portion 2 located closely beneath the surface. In the present embodiment the spacing of the middle portion 2 from the surface 3 is 0.5 $\mu$m., whereas the largest spacing of the curved region 6 from the same surface 3 is 4.5 $\mu$m. and consequently is nine times as large as the spacing of the planar portion 2.

Figure 6:
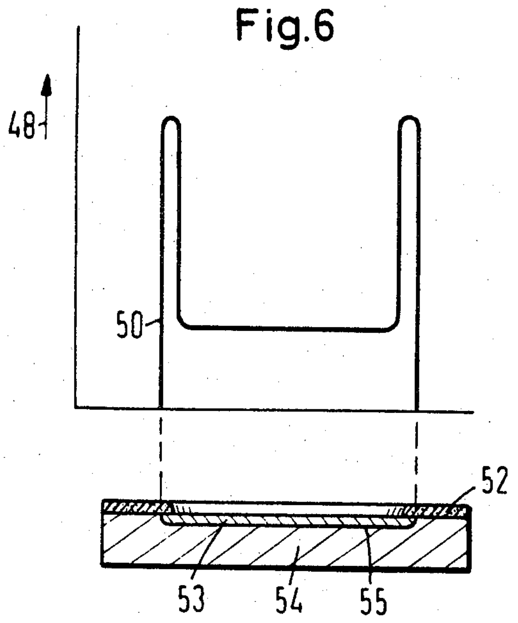
FIGS. 6 and 7 are explanatory, representing pressure-sensitivity diagrams for a known semiconductor device in FIG. 6 and for a semiconductor device according to the invention in FIG. 7.
Figure 7:
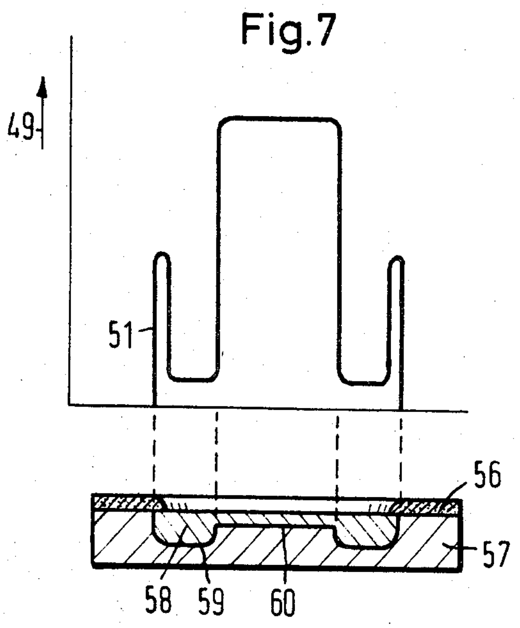

The distribution of the pressure sensitivity across a known planar diode and across a diode according to the invention will be apparent from a comparison of FIGS. 6 and 7. FIG. 6 relates to a normal planar diode without electrical connection, consisting of a semiconductor body 54 of one conductance type and a diffused zone 53 of the opposed conductance type. The p-n junction 55 between the two zones 53 and 54 possesses a broad area parallel to the semiconductor surface but is curved in the marginal region. The curvature radius is determined by the penetrating depth of the planar portion. The localities of the semiconductor surface at which the p-n junction emerges are coated by an oxide layer 52. Curve 50 exhibits the pressure sensitivity obtained by testing various points of the zone 53 with a sapphire needle, this zone having p-type conductance, for example. The arrow 48 indicates the direction of increasing pressure sensitivity. It will be seen from curve 50 that the p-n junction is particularly sensitive to pressure in the marginal regions but that this region is extremely narrow. The essential major area of the p-n junction exhibits an only slight pressure sensitivity.

The corresponding curve 57 in the diagram of FIG. 7 represents the pressure sensitivity of a planar diode according to the invention, the arrow 49 indicating the direction of increasing pressure sensitivity. This planar diode consists of a semiconductor body 57 of one conductance type and a zone 58 of the opposite conductance type. Both zones form a p-n junction which according to the invention possesses a planar portion 60 and a curved marginal portion 59, the distance of portion 59 from the top face being larger than that of the planar portion 60. The localities where the p-n junction emerges at the surface are covered by an oxide coating 56. It will be seen from curve 51 that planar diodes according to the invention exhibit a completely uniform pressure sensitivity in the region of the planar portion of the p-n junction, and the magnitude of this pressure sensitivity has a high value as attainable in the known device only within an extremely narrow marginal region.

According to another feature of the invention, a semiconductor device for response to pressure is provided with a plurality of mutually parallel p-n junctions each having a middle portion which is planar and located closely beneath the surface, each junction having a curved marginal portion on both sides of the planar portion.

Figure 3:
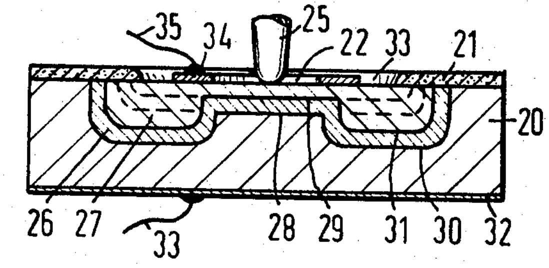
FIG. 3 illustrates in a similar manner a pressure-sensitive device having two p-n junctions according to the invention active as an emitter and as a collector respectively.

The semiconductor device shown in FIG. 3 is provided with two such p-n junctions. It comprises an n-type semiconductor body 20, particularly of silicon, with a p-type diffused zone 26 and another n-type zone 27 likewise produced by diffusion. Each of the two p-n junctions between each two individual zones comprises a planar middle portion 28 or 29, and a curved marginal portion 30 or 31. An oxide coating 21 protects the area of the semiconductor surface where the p-n junctions emerge at this surface. Indicated by broken lines are the p-n junctions as they exist with the known planar devices.

The device according to FIG. 3 is pressure sensitive. A pressure point 25, for example of sapphire, is placed upon the semiconductor surface 22 within the planar portion of the p-n junctions. The point of contact is located in the middle of the two planar portions of the p-n junctions. Located within the opening 23 of the oxide coating 21 is a terminal electrode 34 relating to the zone 27. A lead 35 is connected to the terminal 34. The opposite face of the semiconductor body is provided with an electrical terminal electrode 32 covering the entire area of this face. Another lead 33 is connected to the terminal electrode 32.

The spacing of the pressure-sensitive portion of the p-n junctions, namely the planar portion 28 or 29, from the surface 22, is 0.5 and 1 $\mu$m., respectively. The distance between the partially curved marginal regions 30 and 31 of the p-n junction is preferably kept not larger than 4.5 and 5 $\mu$m., respectively. In operation, the p-n junction closest to the surface 22 is poled, for example, in the blocking direction and consequently acts as a collector, in which case the second p-n junction is poled in the forward direction and acts as an emitter. Such a pressure-sensitive device is applicable for example as a microphone. For this purpose, the point 25 may be connected with a diaphragm excited by sound waves. The pressure variations corresponding to the excitation of the diaphragm result in a corresponding variation of the collector current.

No provision is made in this embodiment for additional control of the collector current through the base zone 26, because this permits omitting a circuit connection for the base zone 26 and results in a simplified design of the device. However, the device may be modified by removing the oxide coating 21 at the locality where the zone 26 emerges at the surface. By then attaching an electrical contact at the stripped locality to the base zone, the device otherwise corresponding to FIG. 3 is also applicable as a transistor. By virtue of the design of the p-n junctions according to the invention, such a transistor exhibits an increased breakdown voltage, as is desirable particularly for the collector p-n junction.

Relative to the pressure sensitivity, each of the two p-n junctions in a device according to FIG. 3 corresponds to the properties typified in FIG. 7 and explained above with reference to FIG. 2.

In a silicon crystal for semiconductor devices, the p-conducting zone is doped, for example with boron, and the n-type zone with phosphorus. Used as contact electrode materials are substance which produce in the adjacent semiconductor zone the same conductance type, that is, a p+ or an n+ zone. In the embodiments described herein, the n-type zones were contacted, for example, with gold-antimony alloy, and the p-conducting zones with aluminum. Due to the high surface concentration resulting from diffusion, the same metal, for example, AlAg may also be used for n-type as well as p-type conductance.

If germanium is employed as semiconductor material, then the p-type zones are doped, for example, with indium, gallium, or indium-gallium; and the n-type zones are doped, for example, with antimony, arsenic or phosphorus. The p-type zones may be contacted with aluminum for example, and the n-type zones with gold-antimony.

Of course, other semiconductor materials, for example III–V semiconductor compounds and other semiconducting compounds, may be used in lieu of germanium and silicon.

Pressure-sensitive semiconductor devices need not be provided with a pressure point. Other forms of pressure tips are likewise applicable. For example, a broad-area plunger having a diameter larger than 20 mm., or a knife edge may be used.

Described in the following are particularly favorable and preferred methods for producing semiconductor devices according to the invention.

Preferably the semiconductor devices are produced in accordance with the known planar technique. According to the invention, it is preferable to subject one of the flat faces of a crystal wafer of semiconductor crystalline material to two, preferably sequential diffusion processes and to thereby diffuse into the surface dopants that produce a type of conductance opposed to that of the original semiconductor body. The indiffusion is performed down to respectively different penetrating depths, in such a manner that the diffusion down to the larger depth overlaps and covers the margin of the diffusion region resulting from the diffusion of the small penetrating depth. The margin of the diffusion having the smaller penetrating depth is understood to refer to the curved portion of a p-n junction made in accordance with the known or planar technique, such as the curved junction portion denoted by 61 in FIGS. 1 and 2.

Due to a preceding diffusion down to larger penetrating depths, and also by virtue of the geometry at the locality where the margin of the diffusion having the smaller penetrating depth is located, the effect of the curvature is virtually eliminated. As a result, the semiconductor devices made in this manner are more uniformly sensitive to pressure in the region of the diffusion performed at the lower penetrating depth, and the resulting p-n junction exhibits an increased breakdown voltage. The diffusion down to larger depth, and the diffusion down to smaller depth can be performed in separate steps of operation. However, both steps of diffusion may be performed simultaneously if the dopant substances employed for the two diffusion processes exhibit different diffusion speeds and a different behavior relative to the masking layer.

According to a particularly advantageous mode of performing the method according to the invention, the following procedure is followed. One face of the flat semiconductor body is covered, preferably by partial oxidation of the semiconductor surface, with the exception of a ring-shaped area. Then a dopant for producing the type of conductivity opposed to that of the semiconductor body is diffused into the exposed ring-shaped area of the surface. Thus, a ring-shaped zone in the semiconductor body is reversely doped. Thereafter, the portion of the coating which determines the inner dimensions of the ring-shaped zone is removed, and a second diffusion process is performed for a period of time shorter than that of the first diffusion process. The dopant used during the second diffusion process also produces a conductance type opposed to that of the original semiconductor body. In this manner, the planar portion of the p-n junction is produced by the second diffusion process.

Figure 4:
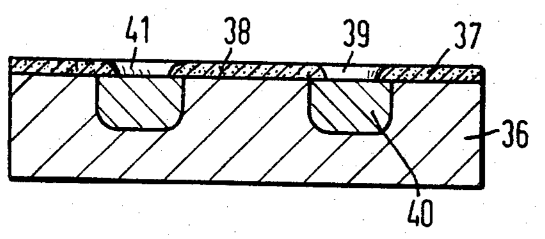
FIG. 4 illustrates in cross section an intermediate product in the manufacture of a semiconductor device according to the invention.
Figure 5:
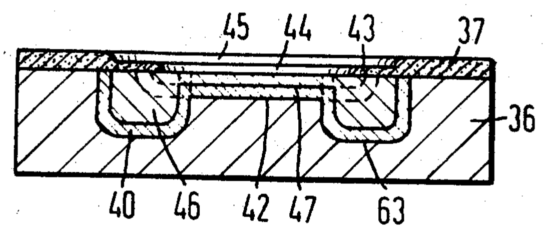
FIG. 5 illustrates another intermediate product occurring in the production of semiconductor devices according to the invention.

Shown in FIG. 4, for example, is a semiconductor crystal consisting for example of monocrystalline n-type silicon which is partially covered with a silicon-dioxide coating composed of portions 37 and 38 leaving a ring-shaped area 39 of the semiconductor surface 41 bare. In FIGS. 4 and 5, the ring-shaped area is circular. This, however, is not necessarily required. The term "ring-shaped" is to be understood to also relate to other shapes closed upon themselves, for example quadrangular, triangular, or elliptical shapes. By diffusion of a dopant for producing a conductance type opposed to that of the semiconductor body 46, there is produced a reversely doped zone 40. In the present example, the reversely doped zone is a p-conducting ring-shaped zone 40.

After forming the zone 40, the portion 38 of the coating that determines the inner dimensions of the ring-shaped zone, this portion 38 having circular shape in FIG. 4, is removed. Thereafter, the above-mentioned, second diffusion process of shorter duration than the first diffusion process is performed. The same dopant as previously used for producing the zone 40 may be used in the second diffusion process and results in the production of a planar junction portion having smaller penetrating depth corresponding to the planar portion denoted by 2 in FIGS. 1 and 2. The contacting of the individual zones is then effected in the known manner, for example by vapor deposition and alloying or tempering of a suitable metal, such as one of the metals specified in the foregoing.

The following modification of the method according to the invention is applicable for producing a plurality of p-n junctions having the particular shape described in the foregoing. After performing the first diffusion process in order to produce the curved marginal portion of the junction, an intermediate diffusion process is performed down to a smaller depth of penetration than that of the first diffusion process, but now the dopant employed is such as to produce the same type of conductance as that of the original semiconductor body. Thereafter, the portion of the coating or masking that determines the inner dimensions of the ring-shaped area, is removed. Then a further (second) diffusion process, also of shorter duration than the first diffusion process, is performed with a dopant for the type of conductance opposed to that of the original semiconductor body, thus producing the first or planar portion of the first p-n junction. Still another diffusion process, again of shorter duration than that of the first diffusion, is applied with a dopant for the same conductance type as that of the original semiconductor body, in order to produce the second planar portion of the second p-n junction.

During the production of the planar portions of the p-n junctions, the semiconductor surface may be masked, with the exception of a circular (polygonal or elliptical) area which is concentric to the ring-shaped region and which is geometrically similar to the ring-shaped region but smaller than the outer dimension of the ring-shaped region, yet larger than the inner dimension of the latter region. Preferably employed for masking the surface up to approximately the middle of the ring-shaped region is the coating which is formed on the semiconductor surface of the ring-shaped region 39 by the production of the curved marginal regions of the p-n junctions. Due to the short diffusion periods required for producing the planar portions of the p-n junctions, it is also possible to obtain the desired diffusion without applying any further masking of the semiconductor surface on the exposed circular area.

This method will be further elucidated with reference to FIG. 5. Shown in this figure is a flat semiconductor body 36 consisting for example of n-type silicon. As explained in conjunction with FIG. 4, a first p-n junction is produced, having a marginal region 63 which, at least in part, is curved with respect to the top face. After this is done, further doping substance is indiffused through the ring-shaped opening 39 in FIG. 4, this dopant producing the same, namely n-type, conductance type as possessed by the original semiconductor body 36. The diffusion is performed down to a slight penetrating depth, the duration of this second diffusion process being dependent upon the diffusion speed of the dopant employed and also upon the desired thicknes of the zone 40. The and also upon the desired thickness of the zone 40. The shaped regions which have portions curved with respect to the top face. These curved portions are partly shown by full lines in FIG. 5 and partly by broken lines.

Thereafter, the portion 38 of the oxide coating (FIG. 4) is removed. The portion of the oxide coating denoted by 43 in FIG. 5 on the semiconductor surface of this ring-shaped region came about during diffusion of dopant through the ring-shaped region. This newly grown oxide coating is now provided in known manner with an opening 44 which, in the present embodiment, is of circular shape. The opening 44 is concentrical to the ring-shaped area 39 and is geometrically similar thereto. The diameter of the opening is smaller than the outer diameter of the ring-shaped region 39 but larger than the diameter of the circular area 38 which, according to FIG. 4, determines the inner dimension of the ring-shaped area 39.

Now, another diffusion of shorter duration than the second diffusion is performed with dopant for the type of conductivity opposed to that of the semiconductor body. This produces the planar portion 42 of the first p-n junction in FIG. 5. Still another diffusion of shorter duration than the next preceding diffusion is performed with dopant for the same conductance type as that of the semiconductor body. This produces the planar portion 47 of the second p-n junction. Indicated by the broken line is the shape of the p-n junction as it would exist without the preceding ring-shaped diffusion. That is, the ring diffusion covers the curved marginal area of the p-n junctions. The duration of the diffusion for production of the planar junction portions is preferably so chosen that the spacing between the two planar portions in both p-n junctions is equal to the spacing between the curved marginal regions of the two p-n junctions. In this manner, of course, multiple-layer semiconductor devices may be produced in which several such p-n junctions are electrically disposed in series.

Especially when producing pressure-sensitive semiconductive devices, care must be taken that the planar portions of the p-n junctions will be located closely beneath the semiconductor surface. This is, the distance of the junctions from the surface, from which the indiffusion is performed, should not be larger than 1 μm.

Ultimately the individual zones are provided with electrical connections in the known manner, particularly in accordance with the planar technique.

While the various method steps have been described with reference to individual semiconductor devices, a number of such devices can be readily produced conjointly within a single large semiconductor plate or wafer from which thereafter the individual semiconductor devices are severed.

Upon a study of this disclosure, such and various other modifications will be obvious to those skilled in the art, and it will be understood that the invention may be given embodiments other than particularly illustrated and described herein, without departing from the essential features of the invention and within the scope of the claims annexed hereto.

We claim:

1. Mechanical-to-electrical transducer comprising in combination a semiconductor device including a semiconductor body having a flat face, said semiconductor body being predominantly of a given conductivity type and having a zone of opposite conductivity type, said zone forming a p-n junction with a planar middle portion of said semiconductor body extending parallel to said face and with a marginal portion of said semiconductor body extending on laterally opposite sides of said middle portion, the penetrating depth of said marginal portion from said face being greater than the penetrating depth of said middle portion therefrom and being at most 1μ, and a pressure tip seated upon said face within the region of said planar middle portion of said p-n junction for controlling the device in response to variable contact pressure of said pressure tip.

2. Mechanical-to-electrical transducer comprising in combination a semiconductor device including a semiconductor body having a flat face, said semiconductor body being mainly of a given conductivity type and having a zone of opposite conductivity type, said zone forming a first p-n junction with a planar middle portion of said semiconductor body extending parallel to said face and with a marginal portion of said semiconductor body extending on laterally opposite sides of said middle portion, the distance of said marginal portion from said face being greater than the distance of said middle portion therefrom, and a zone of said given conductivity type being disposed in said zone of opposite conductivity type, said zone of given conductivity type forming a second p-n junction with a planar middle portion of said zone of opposite conductivity type extending parallel to said face and with a marginal portion of said zone of opposite conductivity type extending on laterally opposite sides of said middle portion of said zone of opposite conductivity type, and a pressure tip seated upon said face within the region of said planar middle portion of said second p-n junction for controlling the device in response to variable contact pressure of said pressure tip.

References Cited

UNITED STATES PATENTS

| | | | |
|---|---|---|---|
| 3,001,111 | 9/1961 | Chappey | 317—235 |
| 3,270,555 | 9/1966 | Rindner et al. | 317—235 X |
| 3,292,057 | 12/1966 | Touchy | 317—234 |
| 3,305,913 | 2/1967 | Loro | 317—235 |
| 3,341,377 | 9/1967 | Wacker | 317—235 |

JAMES D. KALLAM, *Primary Examiner.*

U.S. Cl. X.R.

332—68; 317—235